(12) United States Patent  (10) Patent No.: US 11,209,511 B2
Nittka et al.  (45) Date of Patent: Dec. 28, 2021

(54) MAGNETIC RESONANCE FINGERPRINTING WITH DICTIONARY RECOMPRESSION

(71) Applicant: Siemens Healthcare GmbH, Erlangen (DE)

(72) Inventors: Mathias Nittka, Baiersdorf (DE); Gregor Koerzdoerfer, Erlangen (DE); Peter Speier, Erlangen (DE); Jianing Pang, Chicago, IL (US)

(73) Assignee: Siemens Healthcare GmbH, Erlangen (DE)

( * ) Notice: Subject to any disclaimer, the term of this patent is extended or adjusted under 35 U.S.C. 154(b) by 118 days.

(21) Appl. No.: 16/420,427

(22) Filed: May 23, 2019

(65) Prior Publication Data

US 2019/0361080 A1 Nov. 28, 2019

Related U.S. Application Data

(60) Provisional application No. 62/675,893, filed on May 24, 2018.

(51) Int. Cl.
  *G01R 33/48* (2006.01)
  *G06T 7/00* (2017.01)
  *G01R 33/56* (2006.01)
  *G06T 11/00* (2006.01)

(52) U.S. Cl.
  CPC ..... *G01R 33/4828* (2013.01); *G01R 33/5608* (2013.01); *G06T 7/97* (2017.01); *G06T 11/003* (2013.01)

(58) Field of Classification Search
  None
  See application file for complete search history.

(56) References Cited

U.S. PATENT DOCUMENTS

| 7,668,441 | B2 | 2/2010 | Kim |
| 2002/0009143 | A1 | 1/2002 | Arye |

(Continued)

FOREIGN PATENT DOCUMENTS

| CN | 1585472 A | 2/2005 |
| CN | 107105298 A | 8/2017 |

(Continued)

OTHER PUBLICATIONS

Ma et al., "Magnetic Resonance Fingerprinting," Nature, 495: p. 187-192 (2013).

(Continued)

*Primary Examiner* — Jiangeng Sun
(74) *Attorney, Agent, or Firm* — Schiff Hardin LLP (57) ABSTRACT

Techniques are disclosed for providing a first magnetic resonance fingerprinting dictionary using fingerprints having a first length. A transformation matrix is also utilized that is configured to shorten the fingerprints to a second length that is shorter than the first length. A second magnetic resonance fingerprinting dictionary may then be obtained by multiplying the first magnetic resonance fingerprinting dictionary with the transformation matrix, with the fingerprints of the magnetic resonance fingerprinting dictionary having the second length. This facilitates the storage of a MRF dictionary that takes up less storage space and decreases the time taken to perform scanning operations.

15 Claims, 5 Drawing Sheets

(56) References Cited

U.S. PATENT DOCUMENTS

| | | | |
|---|---|---|---|
| 2005/0041958 A1 | 2/2005 | Kim | |
| 2012/0045139 A1 | 2/2012 | Demidov et al. | |
| 2015/0302579 A1* | 10/2015 | Griswold | G01R 33/5608 382/128 |
| 2017/0115368 A1 | 4/2017 | Chen et al. | |
| 2017/0234951 A1* | 8/2017 | Zhao | G01R 33/50 324/309 |
| 2018/0203082 A1* | 7/2018 | Griswold | G06F 16/56 |
| 2018/0231626 A1* | 8/2018 | Gulani | A61B 5/4312 |
| 2018/0306882 A1* | 10/2018 | Li | G01R 33/56 |
| 2020/0103480 A1 | 4/2020 | Nittka et al. | |

FOREIGN PATENT DOCUMENTS

| | | |
|---|---|---|
| EP | 1083752 A1 | 3/2001 |
| EP | 3629047 A1 | 4/2020 |

OTHER PUBLICATIONS

McGivney et al., "SVD Compression for Magnetic Resonance Fingerprinting in the Time Domain," IEEE Transactions on Medical Imaging, 33 (12): p. 2311-2322 (2014).

Jiang, Yun et al: "MR Fingerprinting Using Fast Imaging with Steady State Precession (FISP) with Spiral Readout"; in Magnetic Resonance in Medicine; vol. 74; pp. 1621-1631; 2015.

Sommer, Karsten et al., "Towards Judging the Encoding Capability of Magnetic Resonance Fingerprinting Sequences," Proceedings of the International Society for Magnetic Resonance in Medicine, ISMRM (2016), 24th Annual Meeting and Exhibition, Singapore, May 7-May 13, 2016, Abstract No. 0429.

Yu, Zidan et al., "Exploring the Sensitivity of Magnetic Resonance Fingerprinting to Different Types of Motion and Possible Correction Mechanisms," Proceedings of the International Society for Magnetic Resonance in Medicine; ISMRM (2017); 25th Annual Meeting and Exhibition; Honolulu, HI, USA; Apr. 22-Apr. 27, 2017; Abstract No. 3938.

European Search Report for Application No. 19174901.9, dated Nov. 11, 2019.

Min, Li et al.:"The technique of Magnetic Resonance Fingerprinting and Its Latest Development"; Science China Press; 2019; pp. 28-40.

Chinese Action dated Mar. 25, 2021, Application No. 201910423694.2.

* cited by examiner

MAGNETIC RESONANCE FINGERPRINTING WITH DICTIONARY RECOMPRESSION

CROSS-REFERENCE TO RELATED APPLICATIONS

The present application claims the benefit of the filing date of U.S. provisional application No. 62/675,893, filed on May 24, 2018, the contents of which are incorporated herein by reference in their entirety.

TECHNICAL FIELD

The present disclosure is directed to magnetic resonance imaging and, in particular, to reducing artifacts in parameter maps created by magnetic resonance fingerprinting ("MRF").

BACKGROUND

A basic problem for acquiring magnetic resonance ("MR") images relates to the scan time. In particular, this scan time was initially reduced by software methods in the form of optimized pulse sequences, in which the flip angle of the pulses, the number thereof, the setting of the gradients or the waiting times between individual sequence sections, was modified. It was thus possible to reduce the acquisition of a gradient echo image using the FLASH method from several minutes to a few seconds. Although this changes the contrast behavior, it remains $T^*_2$ dependent. The RARE method is well-known as a fast, spin echo based imaging method. Other methods such as GRASE or TrueFISP (i.e., fast imaging sequence (FISP)-based method), exist, which involve combinations of the basic methods.

However, with the use of newer scanning methods, such as magnetic resonance fingerprinting methods (MRF methods), the drawback of long scanning times can be reduced to an acceptable extent. But despite these efforts, MRF reconstruction continues to be a challenge, because a compressed dictionary only fits for a defined length of fingerprints that are calculated in advance.

SUMMARY OF THE INVENTION

Again, developments in MRI scanning technology have aimed to reduce scan time. To achieve a further reduction in the acquisition time, it has been proposed to use multiple coils for reading out the scan signal. In this case, not all the k-space lines are acquired. Instead, only selected k-space lines are acquired using the multiple coils. This technique is also known as undersampling. To prevent an aliasing artifacts, i.e. foldover effects, which appear in the reconstructed image due to this procedure, different reconstruction algorithms are used that require fewer k-space lines, and therefore the more time-consuming scanning (filling) of the k-space lines is unnecessary.

Such reconstruction methods are commonly referred to under the acronyms GRAPPA (GeneRalized Autocalibrating Partially Parallel Acquisition), SENSE (SENSitivity Encoding for fast MRI) and SMASH (SiMultaneous Acquisition of Spatial Harmonics). However, even if these methods have resulted in reduced scan time, the acquisition of a parameter map like a T1-map remains time consuming. Therefore, conventional images are typically acquired having a known weight with regard to physical parameters. For example, a FLASH sequence having a long echo time TE produces $T^*_2$ weighted images.

These qualitative images can be generally interpreted by a radiologist or a physician for specific disease signatures. Such an interpretation requires a great deal of experience, but remains highly subjective as only signal differences are examined.

In contrast, with the use of quantitative MR imaging techniques, absolute properties of the scanned examination object (e.g., a patient or subject or portion thereof) may be determined in humans, such as the tissue-specific T1 and T2 relaxation, for instance. The property can be represented, for example, as parameter maps, which reproduce the parameter values such as the respective relaxation times in a spatially resolved manner. Quantitative techniques therefore provide the advantage of an objective comparability, but due to long scanning times are rarely used.

With the use of newer scanning methods such as magnetic resonance fingerprinting (MRF), the drawback of long scanning times can be reduced to an acceptable extent. An example of magnetic resonance fingerprinting methods are described, for example, in reference [1]. The principle of these methods is to generate, by pseudo random variation of sequence parameters (flip angle, TR, gradient, etc.), well differentiable signal characteristics for various substances. For instance, different relaxation parameters of a substance yield differing signal evolutions in response to an excitation pattern. The acquired signal evolutions are compared with a large number of simulated signal evolutions, which were created in advance. A single simulated signal evolution is called a "fingerprint" in this context. Moreover, the totality of the fingerprints is called a "dictionary." The fingerprints are simulated by varying the desired parameters (i.e. T1, T2, B0, B1, or ADC), with the latter representing the apparent diffusion coefficient. The process of comparing measured and simulated signal evolutions and finding the best match is called "matching." The fingerprint characteristic which is most similar to the scanned one determines the relaxation parameters, for example T1 and T2, of the pixel in question, which, in turn, allows conclusions to be made as to the tissue from which the MR signal originated, to create that pixel's signal.

To generate the signal evolutions, up to 3000 images are acquired. In this case, every fingerprint has 3000 complex data points. If the desired parameters that span the dictionaries' non-time dimensions are varied in reasonable steps, the dictionary can easily contain tens of thousands of fingerprints even if only three parameters are varied. As a result, the dictionary may contain several Gigabytes of data. With four parameters, this can be on the order of several Terabytes. Additionally, this further leads to the time for matching being increased.

To reduce the processing time, there are conventional techniques to compress the dictionary. One example of dictionary compression is described in reference [2]. In this case, the uncompressed dictionary D, which is a matrix, is factorized according to the singular value decomposition: $D = U\Sigma V^*$, where $U \in \mathbb{C}^{p \times p}$ and $V \in \mathbb{C}^{q \times q}$ are unitary matrices, and $\Sigma \in \mathbb{R}^{p \times q}$ is a diagonal matrix containing the non-increasing singular values $\sigma_i$; $i=1, \ldots, \min\{p, q\}$. The dictionary D is then approximated by a low-rank approximation $D \approx U_k \Sigma_k V_k^*$, where $k < r$, $r = \text{rank}(D)$.

The compressed dictionary $D_k$ is calculated by multiplying the uncompressed dictionary with the so called compression matrix $V_k$:

$$D_k = V^*_k D.$$

After the described operations have been performed a matrix $\Sigma_k$ is generated that contains the singular values, as well as the compression matrix $V_k$ with the basis vectors, and the compressed dictionary $D_k$ containing the coefficients for the basis vectors. However, to match an acquired signal evolution with the content of the compressed dictionary $D_k$, the signal evolution x also has to be compressed:

$$x_k = V^*_k x.$$

The compressed vector $x_k$ also contains coefficients for the basis vectors of the compression matrix $V_k$. Then, the matching process can be executed by comparing the coefficients of $x_k$ with those of $D_k$. This process reduces disk usage and processing time simultaneously.

Performing full template matching between acquired signals and a compressed MRF dictionary may be computationally less intensive compared to a conventional MRF dictionary containing all time points. But despite these efforts, MRF reconstruction continues to be a challenge, because the compressed dictionary only fits for a defined length of fingerprints that are known or otherwise provided in advance.

Thus, an object of the aspects as described herein is to provide additional flexibility with regards to the number of images used for creating a signal evolution.

In accordance with an aspect, a method is provided for creating a dictionary corresponding to the length of a currently-acquired signal evolution, the method including the following method steps:

First, providing a first magnetic resonance fingerprinting dictionary, the fingerprints of the magnetic resonance fingerprinting dictionary having a first length. The first magnetic resonance fingerprinting dictionary may contain, as explained above, information on simulated signal evolutions (i.e., the so-called fingerprints). The fingerprints have a first length, which is the maximum length for simulated signal evolutions available. Therefore, the first length is in the time domain and is one of the dimensions of the uncompressed first magnetic resonance dictionary.

Second, the method includes providing at least one transformation matrix, which is configured to shorten the fingerprints to a second length that is shorter than the first length. The transformation matrix can fulfill several steps at the same time. In an aspect, the transformation matrix at least shortens the fingerprints. As a result, the aspects described herein provide that the second length is shorter than the first length. To facilitate this functionality, aspects include providing one dictionary that is available on a storage medium, and generating a transformation matrix for each additional dictionary. The transformation matrices are smaller in size than a complete dictionary, and therefore storage space can be reduced. The second length is also in the time domain and has one of the dimensions of the second magnetic resonance fingerprinting dictionary.

Third, the method includes obtaining a second magnetic resonance fingerprinting dictionary by multiplying the first magnetic resonance fingerprinting dictionary with the transformation matrix. This results in the fingerprints of the magnetic resonance fingerprinting dictionary having the second length. After creating the second magnetic resonance fingerprinting dictionary, the parameters associated with a signal evolution can be determined.

For instance, as an example let the first length be 3000. In this case, complex data points are used. The first dictionary can be used to determine parameters acquired by using a MRF pulse sequence that creates 3000 images. Of course, the simulation algorithm used to generate the fingerprints of the first dictionary may be based on the scan parameters of the pulse sequence. Continuing this example, if the number of images is reduced to 2000, for instance, then the matching procedure obviously will fail. The first dictionary cannot be used for determination of the parameters of the signal evolutions.

Thus, one solution is to provide a second dictionary, the fingerprints of which having the correct length (i.e., 2000 in this example). To save storage space, aspects include providing the first magnetic resonance fingerprinting dictionary and a transformation matrix transforming the first magnetic resonance dictionary into a second magnetic resonance fingerprinting dictionary having the desired shorter length, in this case 2000 complex data points for every fingerprint.

Since, theoretically, 2999 additional dictionaries can be necessary, it is clear that the usage of transformation matrices helps save storage space for every length of fingerprint made available. Moreover, the second dimension of the first and second magnetic resonance fingerprinting dictionary is usually given by the number of fingerprints and is kept unchanged during the shortening process.

Accordingly, aspects include storing one first magnetic resonance fingerprinting dictionary having a first length, which is the maximum length available. Such a first dictionary may be transformed to a second dictionary of a desired shorter length (second length), by the transformation matrix, which may be calculated in advance and provided on the MRI system. According to various embodiments, a number of transformation matrices may be provided, which are designed to shorten the fingerprints to a number of different second lengths, i.e. for various second lengths.

In an embodiment, the first magnetic resonance fingerprinting dictionary may be stored in a compressed state. For instance, the first magnetic resonance fingerprinting dictionary may be compressed via Singular Value Decomposition (SVD) compression. For example, the first magnetic resonance fingerprinting dictionary may be compressed via a compression matrix adapted to the first length. This advantage produces the first dictionary requiring even less storage space.

According to an embodiment, the transformation matrix may be further configured to decompress the first magnetic resonance fingerprinting dictionary, particularly if the first magnetic resonance fingerprinting dictionary is in a compressed state. Decompression may be done, for instance, by multiplication of the adjunct of the compression matrix adapted to the first length. By further multiplication with the compression matrix for a shorter (second) length, one receives a compressed second magnetic resonance imaging fingerprinting dictionary having a shorter (second) length. Accordingly, in an embodiment, the transformation matrix may be the product of a decompression matrix and a compression matrix, such as the adjunct of the compression matrix adapted to the first length and a compression matrix for a shorter (second) length. In this way, storage space can be saved.

According to an embodiment, the transformation matrix may be further configured to compress the second magnetic resonance fingerprinting dictionary, in particular as explained above. Again, this saves storage space. Usually, such compression is associated with information loss, since this will result in effective data compression.

According to an embodiment, the second magnetic resonance fingerprinting dictionary may be compressed to a rank lower than the rank of the first magnetic resonance fingerprinting dictionary.

The embodiments described herein are also directed to a set of transformation matrices for shortening the fingerprints of a first magnetic resonance fingerprinting dictionary to a set of second lengths shorter than the first length, as described herein. In accordance with an embodiment, a magnetic resonance imaging (MRI) system is disclosed comprising a magnet system configured to generate a polarizing magnetic field about at least a portion of a subject arranged in the MRI system, a plurality of gradient coils configured to apply a gradient field to the polarizing magnetic field, a radio frequency (RF) system configured to apply an excitation field to a subject and acquire MR image data from a region of interest (ROI), a storage medium providing a first magnetic resonance fingerprinting dictionary, and a transformation matrix. The transformation matrix may be configured to transform the first magnetic resonance fingerprinting dictionary to a second magnetic resonance fingerprinting dictionary, with the second magnetic resonance fingerprinting dictionary being smaller than the first magnetic resonance fingerprinting dictionary and corresponding to the length of measured signal evolutions.

The MRI system may further include a computer system programmed to: control the plurality of gradient coils and the RF system to acquire magnetic resonance fingerprinting (MRF) data from a subject; reconstruct an MRF time series of images from the MRF data; obtain signal evolutions out of the time series of images; obtain the second magnetic resonance fingerprinting dictionary; obtain MR parameters by matching the signal evolutions with the second magnetic resonance fingerprinting dictionary; and generate MR parameter maps from the matched parameters.

The MRI system aspects described herein differ from known systems in providing a transformation matrix that can transform the first magnetic resonance fingerprinting dictionary to a second magnetic resonance fingerprinting dictionary that is smaller and has a shorter length, respectively. The embodiments described herein are also directed to one or more processors configured to execute the method according to the embodiments as described herein. Such processor(s) may be, for example, part of a workstation for controlling an MRI system, part of a standalone computer, PC, cloud computer, server, client-server architecture or any handheld device such as a tablet computer or mobile phone, a portable device such as a laptop, etc.

In accordance with another embodiment, a non-transitory computer-readable storage medium is provided, the storage medium storing computer executable instructions that when executed by a computer (or processor(s) of the computer) control the computer (or processor(s)) to perform a method for creating a dictionary corresponding to a desired length, in particular the length of a currently acquired signal evolution. The method may include the following method steps: providing a first magnetic resonance fingerprinting dictionary, the fingerprints of the magnetic resonance fingerprinting dictionary having a first length, providing at least one transformation matrix, the transformation matrix at least being designed to shorten the fingerprints to a second length shorter than the first length, obtaining a second magnetic resonance fingerprinting dictionary by multiplying the first magnetic resonance fingerprinting dictionary with the transformation matrix, the fingerprints of the magnetic resonance fingerprinting dictionary having the second length.

In accordance with embodiment, a computer program having software code portions is provided, the software code portions causing one or more processors to perform the methods of the embodiments described herein when executed on the processor(s). All advantages, features, and embodiments of the disclosure explained with regard to one embodiment of the disclosure are applicable to any other embodiment of the disclosure.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

The exemplary embodiments as described herein serve to improve conventional magnetic resonance fingerprinting (MRF) by providing a transformation matrix for a magnetic resonance fingerprinting dictionary to adapt the dictionary to current scan parameters. MRF acquires and processes magnetic resonance (MR) data to simultaneously provide quantitative maps of different tissue parameters through pattern recognition. Embodiments include using a predefined magnetic resonance fingerprinting dictionary that may model the possible signal evolutions simulated, by using, for example, Bloch equations with different combinations of various MR parameters. The MR parameters may be one or more parameters selected from among a parameter group including, for instance, $T_1$, $T_2$, $T^*_2$, $B_0$, $B_1$, ADC, and $M_0$. Pattern recognition may be completed by computing the inner product between the noisy signal and predicted signals in the dictionary. The dictionary may also store previously observed signal evolutions.

Example embodiments including applying a compression to the first magnetic resonance fingerprinting dictionary.

Reducing the size of the MRF dictionary in the time domain yields faster reconstruction of the tissue parameters (e.g., $T_1$, $T_2$, off-resonance) without sacrificing the accuracy of MRF.

The example embodiments apply SVD as a compression method to the first magnetic resonance fingerprinting dictionary. Usage of SVD allows compression without information loss.

The example embodiments may comprise a decompression matrix to decompress the first magnetic resonance fingerprinting dictionary. For example, a compressed first magnetic resonance dictionary $Dc_1$ can be decompressed to the uncompressed dictionary $D_1$ by multiplying the decompression matrix $V_k^{-1}$ with the uncompressed dictionary. In this example, the original dictionary may be approximately reproduced as:

$$D_1 \approx V_k^{-1} * Dc_1.$$

For clarity, detailed examples having precise values are provided, although this is by way of example and not limitation. The embodiments as described herein may be applied to any suitable values. Embodiments include n representing the number of time points of a fingerprint, m representing the number of fingerprints, and l representing the number of data points after compression. To provide an illustrative example, values may be m=5000, n=3000, and l=200. Continuing this example, the following relationship is provided:

$$D_1 \in \mathbb{C}^{3000 \times 5000}, Dc_1 \in \mathbb{C}^{200 \times 5000}, V_k^{-1} \in \mathbb{C}^{3000 \times 200}.$$

The index '1' denotes the first magnetic resonance fingerprinting dictionary. The uncompressed dictionary is denoted with the letter D, and the compressed dictionary the letters Dc. This notation is also used for the second dictionary.

In an embodiment, the second magnetic resonance fingerprinting dictionary $D_2$ may be achieved by a multiplication of the first magnetic resonance fingerprinting dictionary $D_1$ with the transformation matrix $T_{j \times n}$:

$$D_2 \approx T_{j \times n} * D_1.$$

The transformation matrix $T_{j \times n} \in \mathbb{C}^{j \times n}$ shortens the first magnetic resonance fingerprinting dictionary $D_1$, which contains fingerprints having a first length. The second dimension is the number of fingerprints m, which remains unchanged in this example. The first length is given denoted as 'n.' The dictionary is thus shortened to j data points. As an example, let j be 2000, then $T_{j \times n} \in \mathbb{C}^{2000 \times 3000}$, and $D_2 \in \mathbb{C}^{2000 \times 5000}$.

In this example, the fingerprints have the length j, which is the second length. This means that the first magnetic resonance fingerprinting dictionary $D_1$ is shortened in the time dimension from m to j. The number of fingerprints m remains unchanged.

The embodiments described herein may comprise the transformation matrix being designed to decompress the first magnetic resonance fingerprinting dictionary. The transformation matrix is thus a combination of the steps of decompression and shortening compression, and is denoted as $T_{j \times l}$:

$$D_2 \approx T_{j \times l} * Dc_1.$$

In an embodiment, the transformation matrix $T_{j \times l} \in \mathbb{C}^{j \times l}$ decompresses and shortens the first magnetic resonance fingerprinting dictionary $Dc_1$, which contains coefficients for the basis vectors of the matrix $V_k$. The transformation matrix $T_{j \times l}$ can be achieved by a combination of the shortening matrix $T_{j \times n}$ and the decompression matrix $V_k^{-1}$:

$$T_{j \times l} = T_{j \times n} * V_k^{-1}.$$

The example systems, storage mediums and methods may comprise the transformation matrix T being designed to compress the second magnetic resonance fingerprinting dictionary $Dc_2$. If the first magnetic resonance fingerprinting dictionary $D_1$ is not compressed the transformation matrix $T_{i \times n}$ shortens the first magnetic resonance fingerprinting dictionary $D_1$ and compresses the second magnetic resonance fingerprinting dictionary $D_2$ to a compressed matrix $Dc_2$ having size i in the compressed dimension:

$$Dc_2 = T_{i \times n} * D_1,$$

where the transformation matrix $T_{i \times n}$ is given by:

$$T_{i \times n} = V_{i \times j} * T_{j \times n}.$$

Hence the transformation matrix $T_{i \times n} \in \mathbb{C}^{i \times n}$ is a product of a compression matrix $V_{i \times j} \in \mathbb{C}^{i \times j}$ that compresses a matrix in one dimension from j to i. The notation says that the matrix $T_{i \times n}$ is of dimension i×n and has complex data points.

The embodiments described herein may comprise the second magnetic resonance fingerprinting dictionary $Dc_2$ being compressed to a rank $kc_2$ that is lower than the rank $k_1$ of the first magnetic resonance fingerprinting dictionary $D_1$. For instance, the rank $kc_2$ may be lower than the rank $kc_1$ of the compressed first magnetic resonance fingerprinting dictionary $D_1$. In some cases, the rank $kc_2$ may be so small that a loss of information occurs. However, this is negligible because the second magnetic resonance fingerprinting dictionary $Dc_2$ is not processed further. On the contrary, this accelerates the matching process. Continuing this example, as a result i may be set to 20.

Therefore, the size of the compressed magnetic resonance fingerprinting dictionary $Dc_2$ may be less than 25% of the size of the first magnetic resonance fingerprinting dictionary $Dc_1$. In an embodiment, the size of the compressed second magnetic resonance fingerprinting dictionary $Dc_2$ is less than 10% of the size of the compressed first magnetic resonance fingerprinting dictionary $Dc_1$.

The embodiments described herein may apply SVD as compression method to the second magnetic resonance fingerprinting dictionary $Dc_2$.

The embodiments described herein may comprise the transformation matrix being designed to decompress the first magnetic resonance fingerprinting dictionary $Dc_1$, to shorten the decompressed first magnetic resonance fingerprinting dictionary $D_1$, and to compress the second magnetic resonance fingerprinting dictionary $Dc_2$. In this case, the transformation matrix is a combination of the steps of decompression and shortening compression, and is denoted as $T_{i \times l}$:

$$Dc_2 \approx T_{i \times l} * Dc_1$$

where the transformation matrix $T_{i \times l} \in \mathbb{C}^{i \times l}$ is given by:

$$T_{i \times l} = V_{i \times j} * T_{j \times n} * V_{n \times l}^{-1}.$$

In an embodiment, the transformation matrix $T_{i \times l}$ is achieved by a combination of the compression matrix $V_{i \times j} \in \mathbb{C}^{i \times j}$, the shortening matrix $T_{j \times n}$, and the decompression matrix $V_{n \times l}^{-1} \in \mathbb{C}^{n \times l}$. The dimensions are thus given by, in this example, as $T_{i \times l} \in \mathbb{C}^{20 \times 200}$, $Dc_2 \in \mathbb{C}^{20 \times 5000}$, $V_{n \times l}^{-1} \in \mathbb{C}^{3000 \times 200}$, $T_{j \times n} \in \mathbb{C}^{2000 \times 3000}$, and $V_{i \times j} \in \mathbb{C}^{20 \times 2000}$.

The embodiments described herein may comprise the signal evolution being compressed before matching. For example, if the second dictionary $Dc_2$ is compressed, then the signal evolution y is also compressed to yield the compressed signal evolution yc:

$$yc = V_{i \times j} * y$$

In an embodiment, the matching is then performed as follows:

The signal evolution yc is of the second length and is smaller than the first length. After compression, the vector yc has coefficients belonging to the matrix $V_{i \times j}$, which includes the basis vectors. In this case, these basis vectors are denoted as $y \in \mathbb{C}^{j \times 1}$ and $yc \in \mathbb{C}^{i \times 1}$. This describes y being a one-column vector having j data points, and yc being a one-column vector having i complex data points.

The embodiments described herein may comprise the calculation and storing of the first magnetic resonance fingerprinting dictionary $D_1$ or $Dc_1$ and the transformation matrices T before executing the MRF pulse sequence generating the raw data. For example, one or more of the first magnetic resonance fingerprinting dictionary $D_1$ or $Dc_1$ and/or the transformation matrices T may be stored before delivering or operating the MR system.

The embodiments described herein may comprise the first magnetic resonance fingerprinting dictionary and the second magnetic resonance fingerprinting dictionary having two dimensions, with one of them being in the time domain and the shortening procedure being carried out in the time domain.

The embodiments described herein may comprise the first magnetic resonance fingerprinting dictionary and the second magnetic resonance fingerprinting dictionary having two dimensions, one of them being in the time domain, and the compression being carried out in the time domain.

The embodiments described herein may comprise the first magnetic resonance fingerprinting dictionary and the second magnetic resonance fingerprinting dictionary having two dimensions, one of them being the number of fingerprints.

This is explained in further detail with reference to the accompanying drawings.

Figure 1:
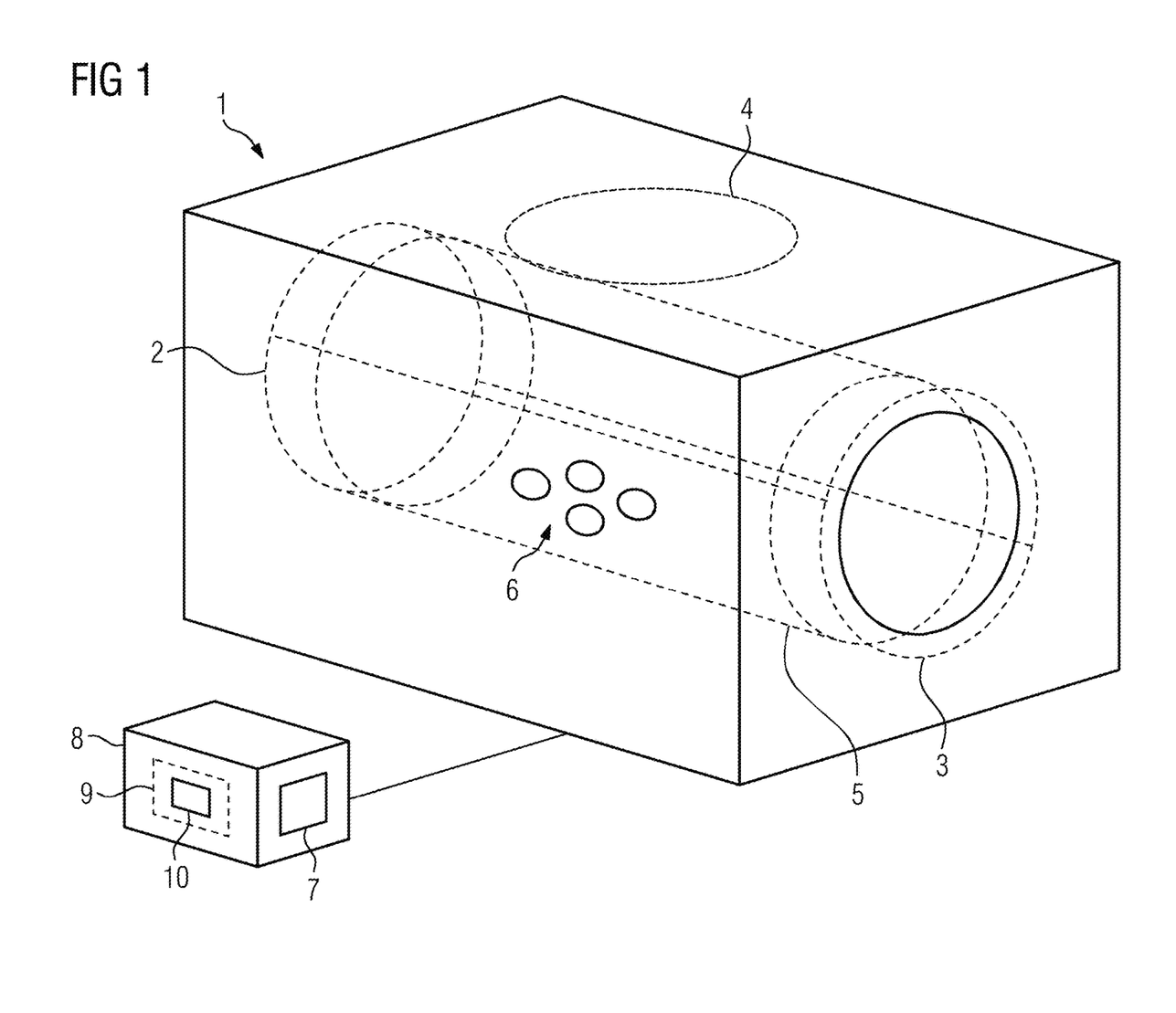
FIG. 1 illustrates a MRI system in accordance with the present aspects.

FIG. 1 shows a magnetic resonance (MR) system 1 having a magnet system, in accordance with the present aspects. The MR system 1 also includes three gradient coils 2, 3 and 4, which are configured to apply a gradient field to the polarizing magnetic field. To apply an excitation field to a subject and acquire MR image data from a region of interest (ROI), a radio frequency (RF) system having two RF coils 5 and 6 is also provided.

The RF coil 5 may be implemented as an excitation coil and the RF coil 6 may be implemented as a detection coil. The RF coil 6 is normally adapted to specific sections of the patient, e.g. as a "head coil," "chest coil," "knee coil," etc. The RF coil 5 is also known as a "body coil" and is less sensitive than the RF coil 6, but is homogeneous over a larger area. The RF coil 6 may be designed as a coil array to allow parallel imaging.

The gradient coils 2, 3, and 4 may produce gradient fields in mutually orthogonal directions. To produce a resulting gradient in a predefined direction, the slice direction, read direction, or phase encoding direction, the gradient fields of two gradient coils, or all three gradient coils 2, 3, and 4, can also be superimposed. A gradient is therefore identical to the gradient field of a single gradient coil only in exceptional cases, and is usually a superposition of a number of gradient fields.

Furthermore, the MR system 1 includes a storage medium 7. The storage medium 7 stores a first magnetic resonance fingerprinting dictionary and a transformation matrix, the transformation matrix being designed to transform the first magnetic resonance fingerprinting dictionary to a second magnetic resonance fingerprinting dictionary, as discussed herein. The storage medium 7 is described in detail later.

The first magnetic resonance fingerprinting dictionary may be an uncompressed first magnetic resonance fingerprinting dictionary $D_1$ or a compressed first magnetic resonance fingerprinting dictionary $Dc_1$. The transformation matrix T may be designed as a shortening matrix $T_{j \times n}$, a decompressing and shortening matrix $T_{j \times l}$, a shortening and compressing matrix $T_{i \times n}$, or a decompressing, shortening, and compressing matrix $T_{i \times l}$.

In an embodiment, the fingerprints of the first magnetic resonance fingerprinting dictionary $D_1$ may have a first length n, and the number of the coefficients may have a number of l. Moreover, to cover signal evolutions being shorter than the first length n, the transformation matrix T is used. Depending on the compression state of the first and second magnetic resonance fingerprinting directory, one of the transformation matrices $T_{j \times n}$, $T_{i \times n}$, $T_{j \times l}$ or $T_{i \times l}$ is used.

Additionally the MR system 1 has a computer system 8 having a processor 9 (which may include one or more processors) programmed to control the plurality of gradient coils 2, 3, 4, and the RF system including the RF coils 5 and 6, and to acquire magnetic resonance fingerprinting (MRF) data from a subject. The computer system 8 may also be configured to reconstruct an MRF time series of images from the MRF data, to obtain signal evolutions out of the time series of images, and to obtain the second magnetic resonance fingerprinting dictionary $D_2$. Still further, the computer system 8 may be configured to obtain (e.g., calculate) MR parameters by matching the signal evolutions with the second magnetic resonance fingerprinting dictionary, and to generate MR parameter maps from the matched parameters.

To provide an illustrative example of the overall operation of the MR system aspects as described herein, the computer system 8 may generate one or more control signals (or receive one or more control signals from other portions of the MR system 1) that result in the execution of various operations, such as the execution of MRF pulse sequences, the generation of image series, the determination of signal evolutions, the generation of dictionaries, the compression and/or decompression of dictionaries, the generation for parameter maps, performing matching, etc., as discussed herein. The various data discussed herein that is used in accordance with the MRI scanning operations (e.g., image series, dictionaries, matrices, parameter maps, etc.) may, once acquired, be stored in any suitable format and in any suitable type of storage medium. For instance, the data may be stored as one or more data files in a memory location that is accessible by the MR system 1 and/or the computer system 8 as described herein.

Moreover, one or more processors associated with the computer system 8 may likewise generate one or more control signals in response to user input, in response to the execution of computer-readable instructions, and/or upon accessing or reading the acquired and stored data, such as the various types of data described herein, for instance. The control signals generated by the one or more processors may thus result in the MR system 1 and the computer system 8 performing the various techniques as described herein. The various computing acts performed by the computer system 8 may be in response to any combination of user input and/or control signals that are automatically generated in response to the occurrence of certain events, e.g., upon completing of the generation of an image series in accordance with MR scanning operations and the creation of parameter maps as discussed herein. The details of these techniques are discussed in further detail below.

Furthermore, although not shown in FIG. 1 for purposes of brevity, the MR system 1 and the computer system 8 may be coupled to or function in accordance with a display system. This display system may include, for instance, any suitable number and/or type of displays such that a quantitative image analysis may be made based upon the parameter maps obtained in accordance with the embodiments as described herein. For instance, as discussed herein, once the parameter maps are generated, one or more absolute properties of a scanned examination object (e.g., the tissue-specific T1 and T2 relaxation) may be appropriately displayed, stored, calculated, etc., such that a medical professional may identify these properties in an appropriate manner.

Figure 2:
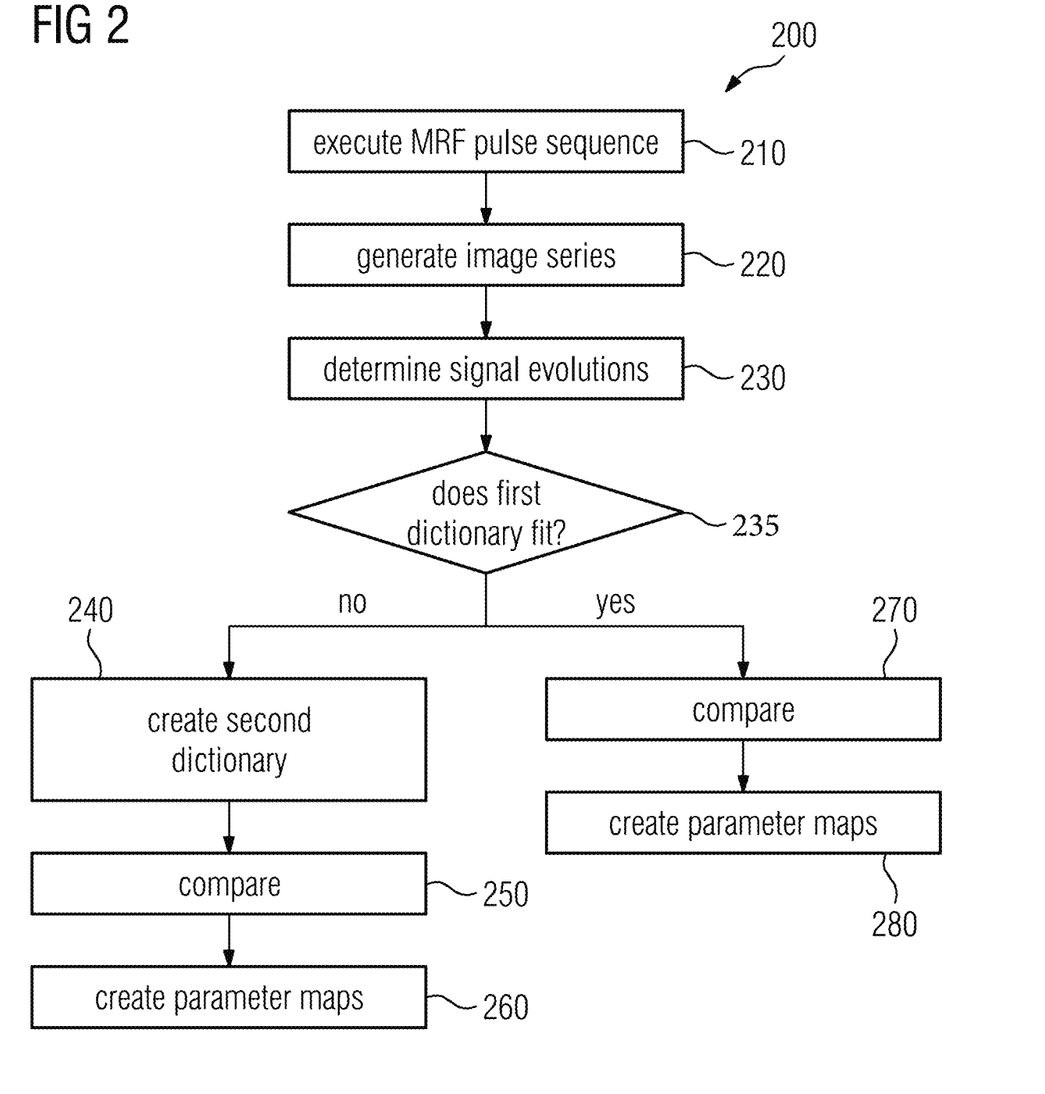
FIG. 2 illustrates a method for generating parameter maps using MRF, in accordance with an aspect of the disclosure.

FIG. 2 illustrates a method for generating parameter maps using MRF, in accordance with an aspect of the disclosure. The method 200 may begin when a MRF pulse sequence is executed (block 210). Embodiments include the MRF pulse sequence being designed to acquire raw data. During application of the pulse sequence, at least one scan parameter, e.g. echo time TE, flip angle α, or repetition time TR, may be varied to create a defined change in the acquired signal over time. The raw data may include information to generate a certain number of images (block 220). Embodiments also include the number of images being a scan parameter, which can be changed.

After having reconstructed the images, embodiments include the signal evolutions being determined (block 230) using the generated (block 220) images. In an embodiment, a signal evolution is received by adding the signal amplitudes of a given pixel for every image of the image series to a vector, which is then the signal evolution of this pixel.

The method 200 may also include, upon determining (block 235) that the length of the first magnetic resonance fingerprinting dictionary does not correspond to the length of the acquired (block 210), the creation (block 240) of a second magnetic resonance dictionary using a transformation matrix T. The various embodiments to generate the second magnetic resonance fingerprinting dictionary are described in detail later.

The method 200 may also include comparing (block 250) the signal evolutions to the entries of the dictionary. This may include, for instance, a compression (block 250) of the signal evolution if the dictionary is compressed. In this case, for each signal evolution, a set of parameters like T1, T2, etc., being available. These parameters may be used, for example, to create (block 260) parameter maps for each parameter.

However, if upon determining (block 235) that the first magnetic resonance fingerprinting dictionary fits, then the length of the signal evolutions, as well as matching (block 270) and creating (block 280) the parameter maps may be performed without generating a second magnetic resonance fingerprinting dictionary.

In an embodiment, the act of determining (block 235) whether the length of the first magnetic resonance dictionary fits does not necessarily need to be performed directly before the matching process. In fact, embodiments include this being performed at any time after the number of images to be acquired is fixed. Then, the generation of the second magnetic resonance fingerprinting dictionary can be done in parallel with the acquisition of the raw data or during the reconstruction of the image series.

Figure 3:
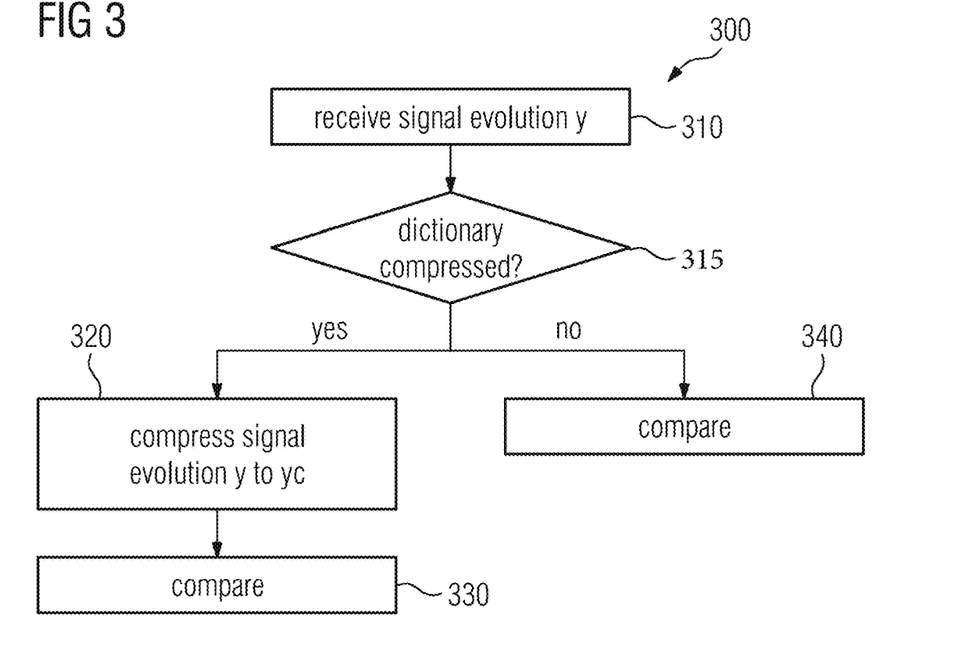
FIG. 3 illustrates an example method of comparing a signal evolution to fingerprints, in accordance with an aspect of the disclosure.

FIG. 3 illustrates an example method of comparing a signal evolution to fingerprints, in accordance with an aspect of the disclosure. The example method 300 as shown in FIG. 3 illustrates comparing a signal evolution to the dictionary entries, which may take place during blocks 250 or 270 of method 200, for example.

Method 300 may include receiving (block 310) signal evolution y. Method 300 may further include determining (block 315), if the dictionary in use, whether the first magnetic resonance fingerprinting dictionary or the second magnetic resonance fingerprinting directory, is a compressed dictionary.

In the case of a compressed dictionary (yes) the signal evolution is also compressed (block 320). This may be executed by using the same compression matrix $V_{i \times j}$ that was used to compress the dictionary $Dc_2$. After the compression of the signal evolution y, the comparison may be performed (block 330). In this example, the coefficients may be compared (block 330) within the SVD domain.

In the case of a uncompressed dictionary (no), the comparison can be done without compression of the signal evolution y (block 340). This comparison (block 340) may occur in the time domain.

Figure 4:
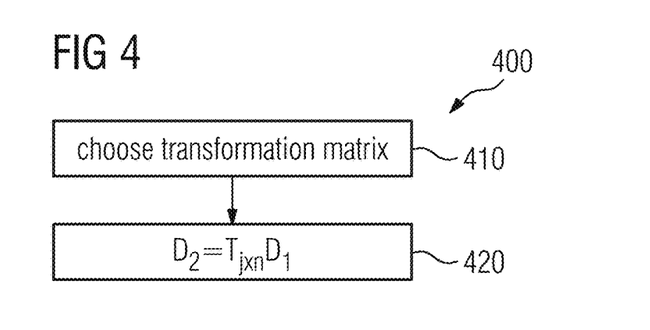
FIG. 4 illustrates an example method, in accordance with an aspect of the disclosure.

FIG. 4 illustrates an example method, in accordance with an aspect of the disclosure. The method 400 as shown in FIG. 4 illustrates an example of creating a second magnetic resonance fingerprinting dictionary $D_2$ in a first embodiment, which may take place during block 240 of method 200, for example.

It should be mentioned that there will be more than one transformations matrix T, independent of the following embodiments. The first magnetic resonance fingerprinting dictionary $D_1$ defines the maximum number of images, which is equivalent to the length of the signal evolutions.

To recover a dictionary corresponding to shorter lengths, a transformation matrix is needed for every length to be generated. The number of transformation matrices can be limited by allowing a restricted possible number of images. The length of the signal evolutions then also only has a limited number of possible values.

For example, the number of images may be a multiple of 100. Then the number of images to be acquired may be 100, 200, 300, . . . , 3000, etc. In this example, only 30 transformation matrices T are necessary, one to shorten the first magnetic resonance fingerprinting dictionary to a length of 100 data points, one to shorten the first magnetic resonance fingerprinting dictionary to a length of 200 data points, and so on.

The method 400 may include selecting (block 410) the transformation matrix $T_{j \times n}$ having a suitable length with regard to the length of the signal evolution is chosen.

The method 400 may include generating and/or receiving (block 420) the uncompressed second magnetic resonance dictionary $D_2$ by multiplying the uncompressed first magnetic resonance dictionary $D_1$ with the transformation matrix $T_{j \times n}$.

Embodiments include the matching process being executed in the time domain. After its usage, the second magnetic resonance dictionary $D_2$ may be deleted again.

The embodiment according to FIG. 4 saves storage space, because the transformation matrix $T_{j \times n}$ is smaller than the second magnetic resonance dictionary $D_2$.

Figure 5:
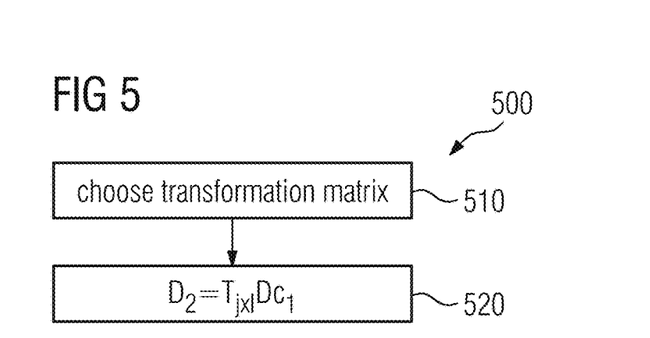
FIG. 5 illustrates an example method of generating a second magnetic resonance fingerprinting dictionary, in accordance with an aspect of the disclosure.

FIG. 5 illustrates an example method of generating a second magnetic resonance fingerprinting dictionary, in accordance with an aspect of the disclosure. The method 500 as shown in FIG. 5 illustrates an example of creating a second magnetic resonance fingerprinting dictionary $D_2$ in a second embodiment, which may take place during block 240 of method 200, for example.

Method 500 may include selecting (block 510) the transformation matrix $T_{j \times l}$ having a suitable length with regard to the length j of the signal evolution. As mentioned herein, a transformation matrix is stored for each length j to be generated.

In the second embodiment, the first magnetic resonance fingerprinting dictionary $Dc_1$ may be compressed. Hence the transformation matrix $T_{j \times l}$ decompresses the compressed first magnetic resonance dictionary $Dc_1$ and shortens it to the uncompressed second magnetic resonance fingerprinting dictionary $D_2$ (block 520):

$$D_2 = T_{j \times l} * Dc_1.$$

The first magnetic resonance fingerprinting dictionary $Dc_1$ may be stored permanently; therefore, a minimization of the used disk space is desired.

Figure 6:
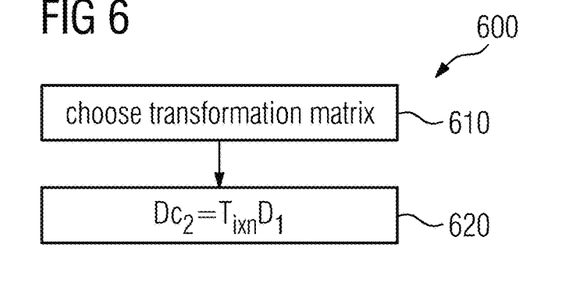
FIG. 6 illustrates an example method of generating a second magnetic resonance fingerprinting dictionary, in accordance with an aspect of the disclosure.

FIG. 6 illustrates an example method of generating a second magnetic resonance fingerprinting dictionary, in accordance with an aspect of the disclosure. The example method 600 as shown in FIG. 6 illustrates an example of creating a compressed second magnetic resonance fingerprinting dictionary $Dc_2$ in a third embodiment, which may take place during block 240 of method 200, for example.

Method 600 includes selecting (block 610) the transformation matrix $T_{i \times n}$ having a suitable length with regard to the length of the signal evolution.

In the second embodiment, the first magnetic resonance fingerprinting dictionary $D_1$ is not compressed. Hence, the transformation matrix $T_{i \times n}$ shortens the first magnetic resonance dictionary $D_1$ and compresses it to the length i of the compressed second magnetic resonance fingerprinting dictionary $Dc_2$ (block 620):

$$Dc_2 = T_{i \times n} * D_1.$$

The compression of the second magnetic resonance fingerprinting dictionary $Dc_2$ can be carried out with or without signal loss. However, the compression to a rank with a significant information loss is preferable for two reasons:

First, the second magnetic resonance fingerprinting dictionary $Dc_2$ may be used more often and stored for a longer time. Since a dictionary $Dc_2$ is necessary for every second length j, several dictionaries $Dc_2$ may be stored. Second, the matching process is faster when the second magnetic resonance fingerprinting dictionary $Dc_2$ is smaller. In other words, the speed of the matching process corresponds inversely to the size of the second MRF dictionary $Dc_2$.

Figure 7:
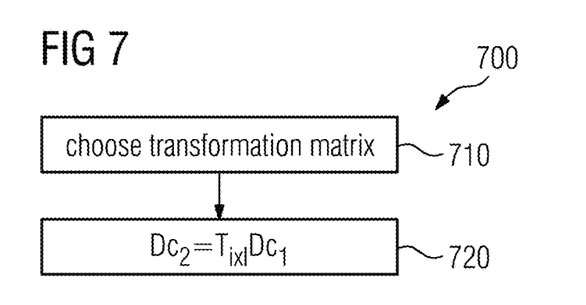
FIG. 7 illustrates an example method of generating a second magnetic resonance fingerprinting dictionary, in accordance with an aspect of the disclosure.

FIG. 7 illustrates an example method of generating a second magnetic resonance fingerprinting dictionary, in accordance with an aspect of the disclosure. The method 700 as shown in FIG. 7 illustrates an example for creating a compressed second magnetic resonance fingerprinting dictionary $Dc_2$ in a fourth embodiment which may take place during block 240 of method 200, for example.

The method 700 may include selecting (block 710) the transformation matrix $T_{i \times l}$ having a suitable length with regard to the length of the signal evolution is chosen.

In the fourth embodiment, the first magnetic resonance fingerprinting dictionary $Dc_1$ is compressed. Hence, the transformation matrix $T_{i \times l}$ decompresses the compressed first magnetic resonance dictionary $Dc_1$, shortens it, and compresses it to the length i of the compressed second magnetic resonance fingerprinting dictionary $Dc_2$ (block 720):

$$Dc_2 = T_{i \times l} * Dc_1.$$

In this example, all benefits of compression are implemented in the fourth embodiment with regard to the generation of the second magnetic resonance fingerprinting dictionary $Dc_2$.

Figure 8:
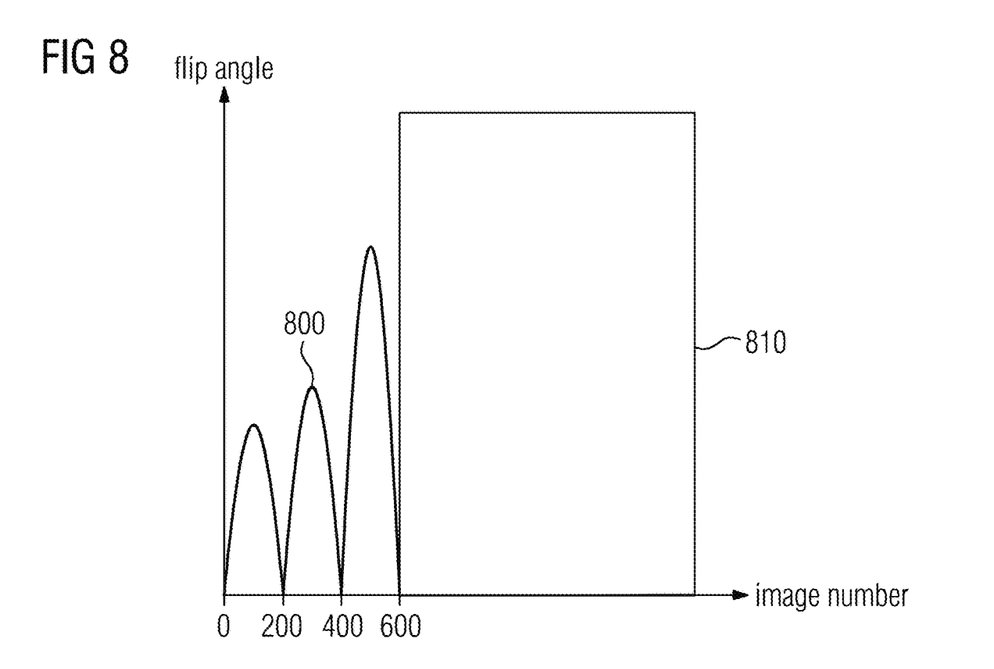
FIG. 8 illustrates a flip angle distribution for an MRF pulse sequence, in accordance with an aspect of the disclosure.

FIG. 8 illustrates a flip angle distribution for an MRF pulse sequence, in accordance with an aspect of the disclosure. As shown in FIG. 8, an illustration is provided for a possible flip angle distribution used to create six hundred images. FIG. 8 shows the flip angle curve 800 with respect to image number. To create the images, a FISP sequence with spiral readout may be used. One excitation pulse is then executed and a total image can be acquired in one shot. Thus, each flip angle represents one image.

To provide an illustrative example, if the first magnetic resonance fingerprinting dictionary $Dc_1$ is designed for a certain number of images (e.g., 3000 images), which is the first length n, then the transformation matrix may shorten it to 600 data points, which is the second length j, according to the number of images acquired. As described herein, the signal evolutions are achieved from the 600 images in a pixel-wise manner.

This is shown by the area 810, which hides the elements removed by the transformation matrix $T_{i \times l}$. Continuing this example, the first magnetic resonance fingerprinting dictionary $Dc_1$ and the second magnetic resonance fingerprinting dictionary $Dc_2$ may be compressed.

Figure 9:
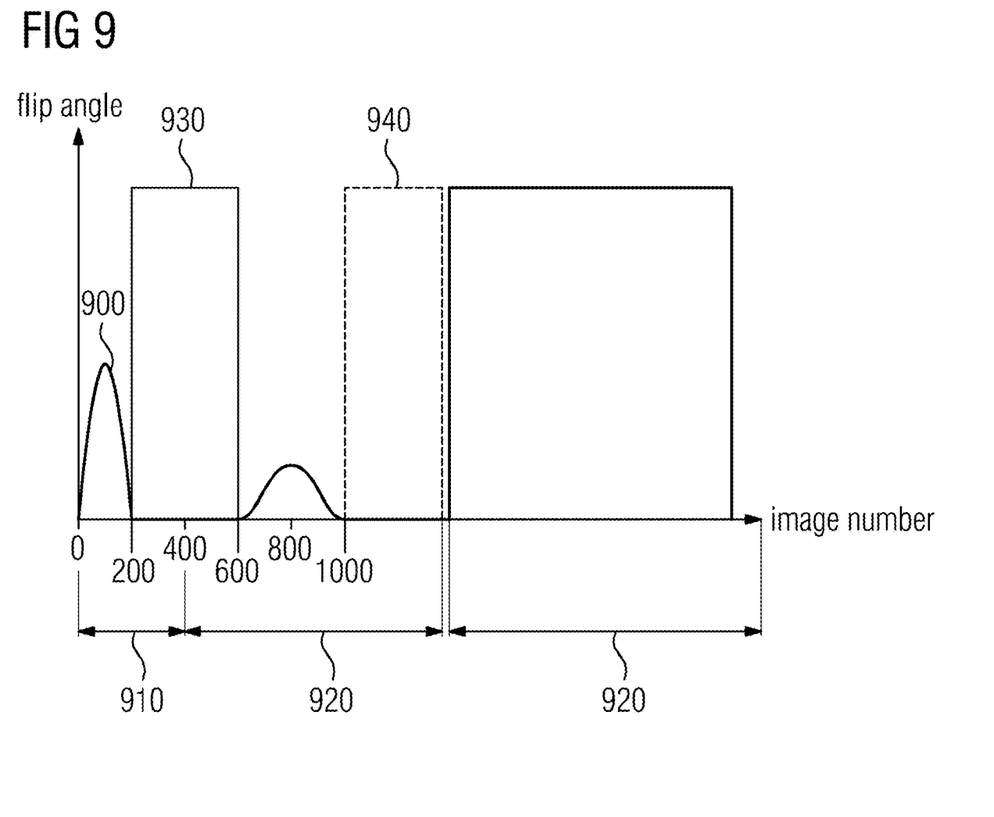
FIG. 9 illustrates a flip angle distribution for an MRF pulse sequence, in accordance with an aspect of the disclosure.

FIG. 9 illustrates a flip angle distribution for an MRF pulse sequence, in accordance with an aspect of the disclosure. As shown in FIG. 9, an illustration is provided for the result of a shortening when the MRF pulse sequence includes different pulse sequences. The curve 900 indicates again the flip angle. In this example, the first 200 images in the first block 910 are acquired using a FISP sequence. Continuing this example, following these 200 acquired images are 400 images acquired with a FLASH sequence in a second block 920. The first magnetic resonance fingerprinting dictionary $Dc_1$ is designed for six hundred images in the first block 910 and eight hundred images in the second block 920. The first block 910 and the second block 920 may be followed by further blocks so that 3000 images (in this example) may be acquired in total.

As shown in FIG. 9, embodiments include the transformation matrix $T_{i \times l}$ removing data points in the middle and at the end of the fingerprints. This is indicated by the masking areas 930 and 940.

It should be noted that the curves 800 and 900 do not show signal evolutions or fingerprints; rather, they show flip angle curves. Every flip angle belongs to an image, and every image adds a data point to a signal evolution. Therefore, a flip angle also represents a data point of a signal evolution even if the signal evolution has a completely different shape.

Figure 10:
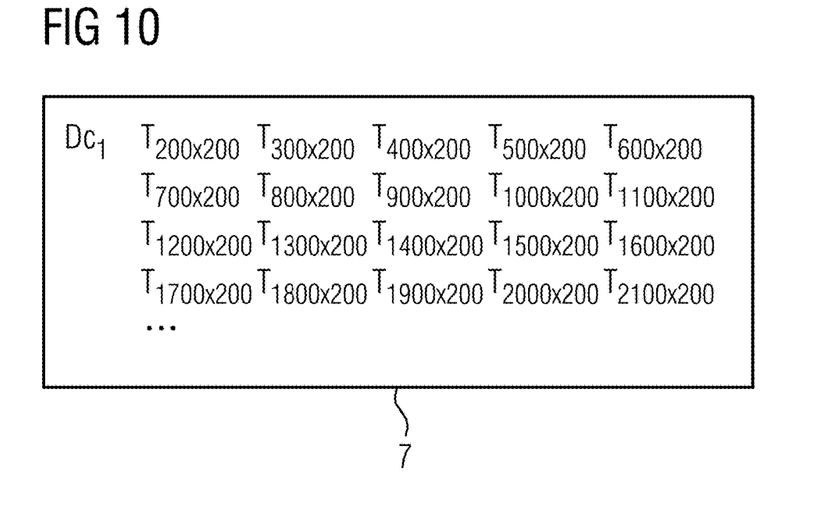
FIG. 10 illustrates a storage medium, in accordance with an aspect of the disclosure.

FIG. 10 illustrates a storage medium, in accordance with an aspect of the disclosure. FIG. 10 shows the storage medium 7 introduced in FIG. 1 in more detail. It can be seen that a compressed first magnetic resonance fingerprinting dictionary $Dc_1$ is stored. Its dimensions are l×m and, for example, $Dc_1 \in \mathbb{C}^{200 \times 5000}$. Hence, in this example there are 5000 fingerprints having a length of 200 data points in the SVD domain. The first length n cannot be seen directly. Additionally, a plurality of transformation matrices can be found. They are of dimension $T_{j \times l} \in \mathbb{C}^{j \times l}$ to distinguish clearly between the different transformation matrices for different second lengths j. The length l is the same length, and matches the length l of the first dictionary $Dc_1$. These transformation matrices can be used to generate second magnetic resonance fingerprinting dictionaries $D_2$ with dimensions j×m, which is j×5000 in this example.

Obviously instead of translation matrices $T_{j \times l} \in \mathbb{C}^{j \times l}$ there could be a plurality of translations matrices $T_{i \times l} \in \mathbb{C}^{i \times l}$ stored. Using the index i, there could be different translation matrices $T_{i \times l}$ having the same indices i and l. This can happen because the matrices are given by:

$T_{i \times l} = V_{i \times l} * T_{j \times n} * V_{n \times l}^{-1}$, which are defined and explained herein and not repeated here for purposes of brevity.

In such a case, the matrices can differ because they were generated using different matrices even if the indices i and l are the same.

The example values of i, j, l, m, and n are provided for ease of explanation and not by limitation.

If no transformation matrix of a length corresponding to the length of the acquired signal evolutions can be found on the storage medium or the MR system, the transformation matrix can be calculated with regard to the used MRF pulse sequence. This can be done either on the MR system or outside, e.g., on a remote and/or large-capacity computer communicatively coupled to the MR system as described herein.

Although modifications and changes may be suggested by those skilled in the art, it is the intention of the inventors to embody within the patent warranted hereon all changes and modifications as reasonably and properly come within the scope of their contribution to the art.

REFERENCES

The following references are cited throughout this disclosure as applicable to provide additional clarity, particularly with regards to terminology. These citations are made by way of example and ease of explanation and not by way of limitation.

Citations to the following references are made throughout the application using a matching bracketed number, e.g., [1].

[1] Ma et al., "Magnetic Resonance Fingerprinting," Nature, 495: p. 187-192 (2013).

[2] McGivney et al., "SVD Compression for Magnetic Resonance Fingerprinting in the Time Domain," IEEE Transactions on Medical Imaging, 33 (12): p. 2311-2322 (2014).

What is claimed is:

1. A computer-implemented method for a magnetic resonance (MR) scanning system, the MR system using magnetic resonance fingerprinting (MRF) associated with signal evolutions obtained from acquired images generated as part of an MR scan of an examination subject, the method comprising:
   storing, via one or more processors, a first MRF dictionary in a compressed state, the first MRF dictionary including fingerprints having a first length;
   generating, via the one or more processors, at least one transformation matrix, the transformation matrix being configured, when multiplied by the first MRF dictionary, to shorten the fingerprints included in the first MRF dictionary to a second length that is shorter than the first length;
   multiplying, via the one or more processors, the first MRF dictionary with the at least one transformation matrix to generate a second MRF dictionary including fingerprints having the second length;
   storing, via the one or more processors, the second MRF dictionary, the storage of the second MRF dictionary utilizing less memory as compared to the storage of the first MRF dictionary as a result of the fingerprints included in the second MRF dictionary having the second length that is shorter than the first length; and
   displaying, via the one or more processors, one or more absolute properties of the examination subject based upon the stored second MRF dictionary.

2. The method of claim 1, wherein the transformation matrix is further configured to decompress the first MRF dictionary.

3. The method of claim 1, wherein the transformation matrix is further configured to compress the second MRF dictionary.

4. The method of claim 1, further comprising:
   matching, via the one or more processors, a signal evolution having the second length to the second MRF dictionary.

5. The method of claim 4, further comprising:
   compressing, via the one or more processors, the signal evolution prior to matching the signal evolution to the second MRF dictionary.

6. The method of claim 1, further comprising:
   selecting, via the one or more processors, the transformation matrix from among a plurality of transformation matrices depending on a number of the acquired images,
   wherein the acquired images are generated using a MRF pulse sequence as part of the MR scan.

7. A magnetic resonance (MR) imaging (MRI) system, comprising:
   a magnet system configured to generate a polarizing magnetic field about at least a portion of a subject;
   a plurality of gradient coils configured to apply a gradient field to the polarizing magnetic field;
   a radio frequency (RF) system configured to apply an excitation field to the subject and to acquire MR image data from a region of interest (ROI);
   a storage medium configured to store a first magnetic resonance fingerprinting (MRF) dictionary in a compressed state and a plurality of transformation matrices, each of the plurality of transformation matrices being configured to transform the first MRF dictionary to a second MRF dictionary, the second MRF dictionary including fingerprints of a second length that are shorter than a first length of fingerprints included in the first MRF dictionary; and
   a computer system programmed to:
      control the plurality of gradient coils and the RF system to acquire MRF data associated with the subject;
      reconstruct an MRF time series of images from the MRF data;
      calculate signal evolutions from the MRF time series of images;
      calculate the second magnetic resonance fingerprinting dictionary;
      calculate MR parameters by matching the signal evolutions with the second MRF dictionary;
      generate MR parameter maps from the matched parameters; and
      display one or more absolute properties of the subject based upon the MR parameter maps.

8. The MR system of claim 7, wherein the size of the second MRF dictionary is less than 25% of the size of the first MRF dictionary.

9. The MR system of claim 7, wherein the computer system is programmed to select a transformation matrix from among the plurality of transformation matrices depending on a number of images chosen in a MRF pulse sequence.

10. A non-transitory computer-readable storage medium storing computer-executable instructions for a magnetic resonance (MR) scanning system using magnetic resonance fingerprinting (MRF), the MRF fingerprinting being associated with signal evolutions obtained from acquired images generated as part of an MR scan of an examination subject, the computer-executable instructions, when executed by one or more processors, causing the one or more processors to:
- store a first magnetic resonance fingerprinting (MRF) dictionary in a compressed state, the first MRF dictionary including fingerprints having a first length,
- generate a plurality of transformation matrices, each of the plurality of transformation matrices being configured to shorten the fingerprints of the first MRF dictionary to a second length that is shorter than the first length;
- select one of the transformation matrices depending on a number of the acquired images, the acquired images being obtained using a MRF pulse sequence,
- multiply the first MRF dictionary with the transformation matrix to generate a second MRF dictionary including fingerprints having the second length;
- store the second MRF dictionary to utilize less memory as compared to storing the first MRF dictionary as a result of the fingerprints included in the second MRF dictionary having the second length that is shorter than the first length; and
- display one or more absolute properties of the examination subject based upon the stored second MRF dictionary.

11. The non-transitory computer-readable storage medium of claim 10, wherein the transformation matrix is configured to decompress the first MRF dictionary.

12. The non-transitory computer-readable storage medium of claim 10, wherein the transformation matrix is configured to compress the second MRF dictionary.

13. The method of claim 1, further comprising:
multiplying the first MRF dictionary in an uncompressed state by a compression matrix that is adapted to the first length to store the first MRF dictionary in the compressed state.

14. The method of claim 13, wherein the act of multiplying the first MRF dictionary with the at least one transformation matrix to generate the second MRF dictionary comprises:
multiplying the first MRF dictionary stored in the compressed state by an adjunct of the compression matrix that is adapted to the first length to decompress the first MRF dictionary.

15. The method of claim 14, wherein the act of multiplying the first MRF dictionary with the at least one transformation matrix to generate the second MRF dictionary comprises:
multiplying the decompressed first MRF dictionary with the compression matrix that is adapted to the second length to store the second MRF dictionary in a compressed state.

* * * * *